US008471341B2

(12) United States Patent      (10) Patent No.: US 8,471,341 B2
Sato et al.      (45) Date of Patent: Jun. 25, 2013

(54) SEMICONDUCTOR DEVICE AND METHOD FOR FABRICATING THE SAME

(75) Inventors: Yoshihiro Sato, Toyama (JP); Atsuhiro Kajiya, Hyogo (JP)

(73) Assignee: Panasonic Corporation, Osaka (JP)

(*) Notice: Subject to any disclaimer, the term of this patent is extended or adjusted under 35 U.S.C. 154(b) by 300 days.

(21) Appl. No.: 12/712,890

(22) Filed: Feb. 25, 2010

(65) Prior Publication Data

US 2010/0148275 A1    Jun. 17, 2010

Related U.S. Application Data

(63) Continuation of application No. PCT/JP2009/003353, filed on Jul. 16, 2009.

(30) Foreign Application Priority Data

Aug. 4, 2008 (JP) ................................. 2008-200880

(51) Int. Cl.
*H01L 27/092* (2006.01)

(52) U.S. Cl.
USPC .................................. 257/369; 257/E27.062

(58) Field of Classification Search
USPC .......................................... 257/369, E27.062
See application file for complete search history.

(56) References Cited

U.S. PATENT DOCUMENTS

| 2002/0153573 A1 | 10/2002 | Mogami |
| 2006/0131676 A1 | 6/2006 | Saito et al. |
| 2007/0034966 A1 | 2/2007 | Kim et al. |
| 2007/0178634 A1 | 8/2007 | Jung et al. |
| 2007/0200186 A1 | 8/2007 | Fujiwara |
| 2008/0135936 A1 | 6/2008 | Nakajima |
| 2008/0135944 A1 | 6/2008 | Ichihara et al. |
| 2008/0150036 A1 | 6/2008 | Jung et al. |
| 2009/0321844 A1* | 12/2009 | Ichihara et al. ............... 257/369 |
| 2010/0164007 A1* | 7/2010 | Onishi et al. .................. 257/369 |

FOREIGN PATENT DOCUMENTS

| JP | 11-297699 | 10/1999 |
| JP | 2006-165090 | 6/2006 |
| JP | 2007-019400 A | 1/2007 |
| JP | 2007-150285 | 6/2007 |
| JP | 2007-208260 | 8/2007 |
| JP | 2007-234686 | 9/2007 |
| JP | 2008-147239 | 6/2008 |
| JP | 2008-147393 | 6/2008 |

OTHER PUBLICATIONS

C. Hobbs et al., "Fermi Level Pinning at the PolySi/Metal Oxide Interface," 2003 Symposium on VLSI Technology Digest of Technical Papers.
T. Hayashi et al., "Cost Worthy and High Performance LSTP CMIS; Poly-Si/HfSiON nMIS and Poly-Si/TiN/HfSiON pMIS," IEDM Technical Digest 2006.

* cited by examiner

*Primary Examiner* — Zandra Smith
*Assistant Examiner* — Paul Patton
(74) *Attorney, Agent, or Firm* — McDermott Will & Emery LLP

(57) ABSTRACT

A semiconductor device includes a first MIS transistor formed on a first active region, and a second MIS transistor formed on a second active region. The first MIS transistor includes a first gate insulating film, and a first gate electrode including a first metal film and a first silicon film. The second MIS transistor includes a second gate insulating film, and a second gate electrode including the first metal film, a second metal film, and a second silicon film.

12 Claims, 8 Drawing Sheets

(a)

(b)

(c)

(d)

(a)

(b)

(a)

(b)

(c)

US 8,471,341 B2

SEMICONDUCTOR DEVICE AND METHOD FOR FABRICATING THE SAME

CROSS-REFERENCE TO RELATED APPLICATION

This is a continuation of PCT International Application PCT/JP2009/03353 filed on Jul. 16, 2009, which claims priority to Japanese Patent Application No. 2008-200880 filed on Aug. 4, 2008. The disclosures of these applications including the specifications, the drawings, and the claims are hereby incorporated by reference in its entirety.

BACKGROUND

The present disclosure relates to a semiconductor device and a method for fabricating the same, and particularly to a semiconductor device including a metal insulator semiconductor field effect transistor (MISFET) having a gate electrode made of a metal material and a method for fabricating the same.

As semiconductor integrated circuit devices have become higher in the degree of integration and operating speed, the miniaturization of MISFETs has been promoted. Instead of conventional gate insulating films formed of silicon dioxide films (or silicon oxynitride films), gate insulating films made of high dielectric materials represented by alumina ($Al_2O_3$), hafnia ($HfO_2$), and hafnium silicate ($HfSiO_x$) have been actively studied for the practical application thereof. Because such a high dielectric film has an extremely high dielectric constant compared with that of a silicon dioxide film, it is possible to increase the thickness of a physical film, and avoid the problem of increased gate leakage current resulting from the thinning of a gate insulating film formed of a silicon dioxide film. However, when a polysilicon film is used for a gate electrode formed on a gate insulating film formed of such a high dielectric film, particularly in a p-type MISFET (hereinafter referred to as a "p-type MIS transistor"), a phenomenon called Fermi level pinning (see, e.g., C. Hobbs et al., "Fermi Level Pinning at the PolySi/Metal Oxide Interface", VLSI Tech. Digest 2003) causes a shift in threshold voltage, which results in the problem of degraded device performance. Accordingly, a high dielectric film can be used as a gate insulating film forming an n-type MISFET (hereinafter referred to as an n-type MIS transistor), but cannot be used as a gate insulating film forming a p-type MISFET. To avoid the problem described above, when a high dielectric film is used as a gate insulating film in a conventional semiconductor device (see, e.g., T. Hayashi et al., "Cost Worthy and High Performance LSTP CMIS; Poly-Si/HfSiON nMIS and Poly-Si/TiN/HfSiON pMIS", IEDM Tech. Digest 2006), a metal gate electrode made of a metal material is used for the gate electrode of a p-type MIS transistor, while a polysilicon film is used for the gate electrode of an n-type MISFET, thereby avoiding the Fermi level pinning in the p-type MIS transistor. Here, it is desirable that the gate electrode of the n-type MIS transistor has a work function of not less than 4.05 eV and not more than 4.6 eV, and the gate electrode of the p-type MIS transistor has a work function of not less than 4.6 eV and not more than 5.15 eV.

To provide the gate electrode of a p-type MIS transistor with a work function of not less than 4.6 eV and not more than 5.15 eV when, e.g., titanium nitride is used as the metal material of the gate electrode, it is necessary to inhibit the diffusion of silicon from a polysilicon film formed on the titanium nitride (see, e.g., S. Sakashita et al., "Diffusion control technique in TiN stacked metal gate electrodes for p-MIS-FETs", Ext. Abst. SSDM 2006). As a method for inhibiting the diffusion of silicon, there has been known a method which increases the thickness of a physical film of a gate metal material (a single-layer structure or a laminated structure of different metal materials), a method which increases the density of (densifies) a film of a gate metal material, or the like.

A method for fabricating a conventional semiconductor device will be described below with reference to FIGS. 8A-8C. FIGS. 8A-8C are cross-sectional views showing the principal portion of the conventional semiconductor device in the gate length direction thereof in the order of the process steps of the fabrication method therefor. In each of the drawings, a left-hand region is an n-type MIS formation region 10N where an n-type MIS transistor is to be formed, and a right-hand region is a p-type MIS formation region 10P where a p-type MIS transistor is to be formed.

As shown in FIG. 8A, an isolation region 101 is selectively formed in an upper portion of a semiconductor substrate 100. As a result, a first active region 100a surrounded by the isolation region 101 is formed in the n-type MIS formation region 10N, while a second active region 100b surrounded by the isolation region 101 is formed in the p-type MIS formation region 10P. Then, a p-type well region 102a is formed in the semiconductor substrate 100 in the n-type MIS formation region 10N, while an n-type well region 102b is formed in the semiconductor substrate 100 in the p-type MIS formation region 10P.

Subsequently, over the semiconductor substrate 100, a gate-insulating-film forming film 103, and a metal film 104 made of a gate electrode material for the p-type MIS transistor are successively deposited, and then a resist mask 105 covering the p-type MIS formation region 10P, and having an opening corresponding to the n-type MIS formation region 10N is formed on the metal film 104 by a photolithographic process.

Next, as shown in FIG. 8B, the metal film 104 formed on the gate-insulating-film forming film 103 in the n-type MIS formation region 10N is removed by a wet etching process using the resist mask 105. Subsequently, the resist mask 105 is removed, and then a silicon film 106 formed of, e.g., a polysilicon film having a thickness of 100 nm is deposited by, e.g., a CVD process on the gate-insulating-film forming film 103 in the n-type MIS formation region 10N and on the metal film 104 in the p-type MIS formation region 10P.

Next, as shown in FIG. 8C, a resist (not shown) having a gate pattern configuration is formed on the silicon film 106 by a photolithographic process. Thereafter, using the resist as a mask, the silicon film 106, the metal film 104, and the gate-insulating-film forming film 103 are successively patterned by a dry etching process. As a result, a first gate insulating film 103a and a first silicon film 106a are successively formed over the first active region 100a, while a second gate insulating film 103b, a second metal film 104b, and a second silicon film 106b are successively formed over the second active region 100b.

In this manner, a first-gate-electrode forming portion 106A having the first gate insulating film 103a and the first silicon film 106a is formed over the first active region 100a, while a second-gate-electrode forming portion 106B having the second gate insulating film 103b, the second metal film 104b, and the second silicon film 106b is formed over the second active region 100b.

SUMMARY

As shown in FIG. 8B mentioned above, when the metal film 104 formed on the gate-insulating-film forming film 103 in the n-type MIS formation region 10N is removed by a wet etching process using the resist mask 105 (see FIG. 8A), the surface of the gate-insulating-film forming film 103 is exposed to wet etching. This causes damage to the gate-insulating-film forming film 103, resulting in the problem of increased leakage current.

In view of the foregoing, an object of the present invention is to reduce degradation due to gate leakage current in a semiconductor device including an n-type MIS transistor and a p-type MIS transistor which have respective gate electrodes formed of metal films having different thicknesses.

To attain the foregoing object, example embodiments according to the present invention will be summarized.

A semiconductor device is a semiconductor device including: a first MIS transistor formed on a first active region of a semiconductor substrate; and a second MIS transistor formed on a second active region of the semiconductor substrate, wherein the first MIS transistor includes: a first gate insulating film formed on the first active region; and a first gate electrode including a first metal film formed on the first gate insulating film, and a first silicon film formed on the first metal film, and the second MIS transistor includes: a second gate insulating film formed on the second active region; and a second gate electrode including the first metal film formed on the second gate insulating film, a second metal film formed on the first metal film, and a second silicon film formed on the second metal film.

In the semiconductor device, the first metal film and the second metal film are made of the same metal material, and a density of the first metal film is lower than a density of the second metal film.

In the semiconductor device, the first metal film and the second metal film are made of different metal materials.

In the semiconductor device, the first gate electrode further includes a conductive film formed on the first metal film, and a second metal film formed between the conductive film and the first silicon film.

In the semiconductor device, the conductive film is formed of a silicon film.

In the semiconductor device, a thickness of the first metal film is not less than 1 nm and not more than 5 nm.

In the semiconductor device, the first gate insulating film and the second gate insulating film are made of the same insulating material.

In the semiconductor device, each of the first gate insulating film and the second gate insulating film includes a high dielectric constant film made of a metal oxide having a specific dielectric constant of not less than 10.

In the semiconductor device, the first gate electrode further includes a first silicide film formed in an upper portion of the first silicon film, and the second gate electrode further includes a second silicide film formed in an upper portion of the second silicon film.

The semiconductor device further includes: an insulating film formed over the semiconductor substrate so as to cover the first gate electrode and the second gate electrode.

The semiconductor device further includes: first sidewalls formed on side surfaces of the first gate electrode, and each having an L-shaped cross-sectional shape; and second sidewalls formed on side surfaces of the second gate electrode, and each having an L-shaped cross-sectional shape, and the insulating film is formed in contact with respective upper surfaces of the first sidewalls and the second sidewalls.

In the semiconductor device, the first MIS transistor is an n-type MIS transistor, and the second MIS transistor is a p-type MIS transistor.

A first method for fabricating a semiconductor device is a method for fabricating a semiconductor device having a first MIS transistor formed on a first active region of a semiconductor substrate and a second MIS transistor formed on a second active region of the semiconductor substrate which includes the steps of: (a) forming, in the semiconductor substrate, the first active region and the second active region each surrounded by an isolation region; (b) forming, over the first active region and the second active region, a gate-insulating-film forming film, a first metal film, and a second metal film in this order; (c) removing the second metal film formed over the first active region; (d) after the step (c), forming a silicon film over the semiconductor substrate; and (e) after the step (d), performing patterning to form, over the first active region, a first-gate-electrode forming portion including a first gate insulating film formed of the gate-insulating-film forming film, the first metal film, and the silicon film, and form, over the second active region, a second-gate-electrode forming portion including a second gate insulating film formed of the gate-insulating-film forming film, the first metal film, the second metal film, and the silicon film.

The first method for fabricating the semiconductor device further includes the step of: (f) after the step (e), forming an insulating film over the semiconductor substrate so as to cover the first-gate-electrode forming portion and the second-gate-electrode forming portion therewith.

The first method for fabricating the semiconductor device further includes the step of: (g) after the step (e) and before the step (f), forming first sidewalls each having an L-shaped cross-sectional shape on side surfaces of the first-gate-electrode forming portion, while forming second sidewalls each having an L-shaped cross-sectional shape on side surfaces of the second-gate-electrode forming portion, and the step (f) includes the step of forming the insulating film such that the insulating film is in contact with respective upper surfaces of the first sidewalls and the second sidewalls.

A second method for fabricating a semiconductor device is a method for fabricating a semiconductor device having a first MIS transistor formed on a first active region of a semiconductor substrate and a second MIS transistor formed on a second active region of the semiconductor substrate which includes the steps of: (a) forming, in the semiconductor substrate, the first active region and the second active region each surrounded by an isolation region; (b) forming, over the first active region and the second active region, a gate-insulating-film forming film, a first metal film, and a conductive film in this order; (c) removing the conductive film formed over the second active region; (d) after the step (c), forming a second metal film on the conductive film in the first active region and on the first metal film in the second active region; (e) after the step (d), forming a silicon film over the semiconductor substrate; and (f) after the step (e), performing patterning to form, over the first active region, a first-gate-electrode forming portion including a first gate insulating film formed of the gate-insulating-film forming film, the first metal film, the conductive film, the second metal film, and the silicon film, and form, over the second active region, a second-gate-electrode forming portion including a second gate insulating film formed of the gate-insulating-film forming film, the first metal film, the second metal film, and the silicon film.

The second method for fabricating the semiconductor device further includes the step of: (g) after the step (f), forming an insulating film over the semiconductor substrate so as to cover the first-gate-electrode forming portion and the second-gate-electrode forming portion therewith.

The second method for fabricating the semiconductor device further includes the step of: (h) after the step (f) and before the step (g), forming first sidewalls each having an L-shaped cross-sectional shape on side surfaces of the first-gate-electrode forming portion, while forming second sidewalls each having an L-shaped cross-sectional shape on side surfaces of the second-gate-electrode forming portion, and the step (g) includes the step of forming the insulating film such that the insulating film is in contact with respective upper surfaces of the first sidewalls and the second sidewalls.

In the first or second method for fabricating the semiconductor device, the first MIS transistor is an n-type MIS transistor, and the second MIS transistor is a p-type MIS transistor.

In the semiconductor device and each of the methods for fabricating the same described above, there is no need to remove the metal film formed on the gate-insulating-film forming film. Therefore, it is possible to inhibit the degradation due to gate leakage current.

In addition, when the first- and second-gate-electrode forming portions are formed by etching, the metal films are formed on the respective gate-insulating-film forming films in the n-type MIS formation region and in the p-type MIS formation region. This prevents the gate insulating film in either one of the n-type MIS formation region and the p-type MIS formation region from being etched by a breakthrough step during gate etching, and allows accurate implementation of the gate electrodes of the n-type and p-type MIS transistors.

BRIEF DESCRIPTION OF THE DRAWINGS

FIGS. 1A-1C are structural views of a semiconductor device according to a first illustrative example embodiment, of which FIG. 1A is a plan view, FIG. 1B is a cross-sectional view in a gate width direction along the line Ib-Ib of FIG. 1A, and FIG. 1C is a cross-sectional view including a left-hand cross section in a gate length direction along the line Icn-Icn of FIG. 1A and a right-hand cross section in the gate length direction along the line Icp-Icp of FIG. 1A.

DETAILED DESCRIPTION

Figure 1:
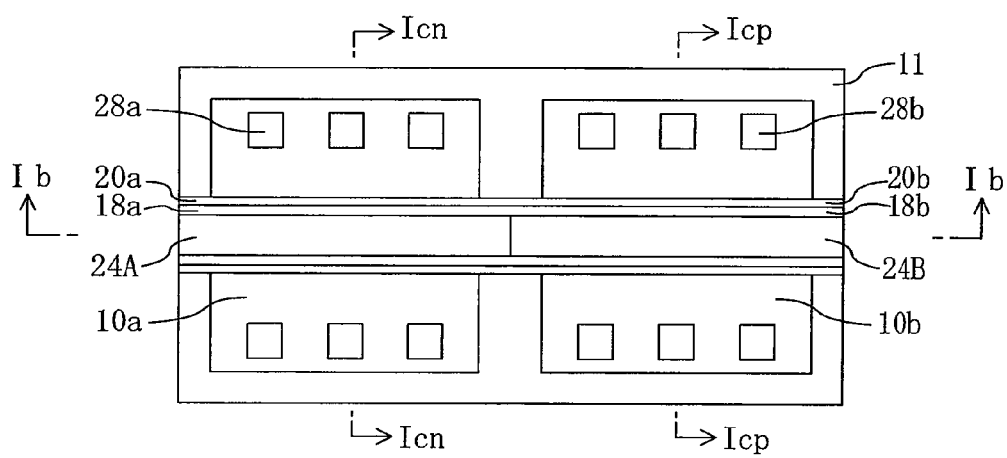
Figure 1:
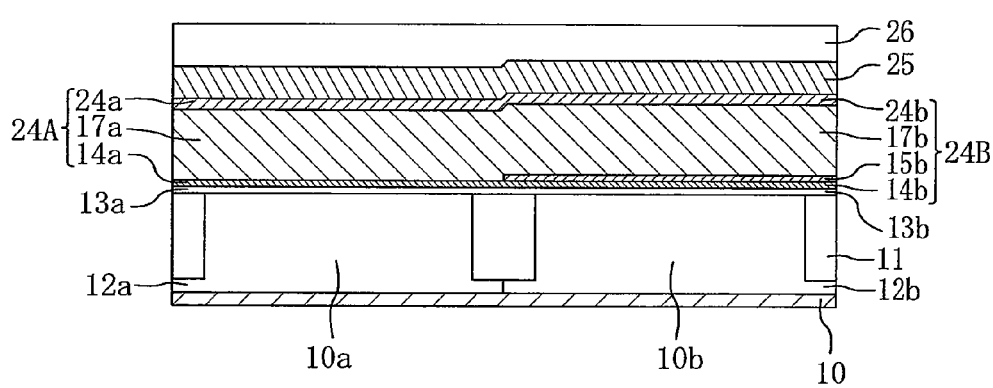
Figure 1:
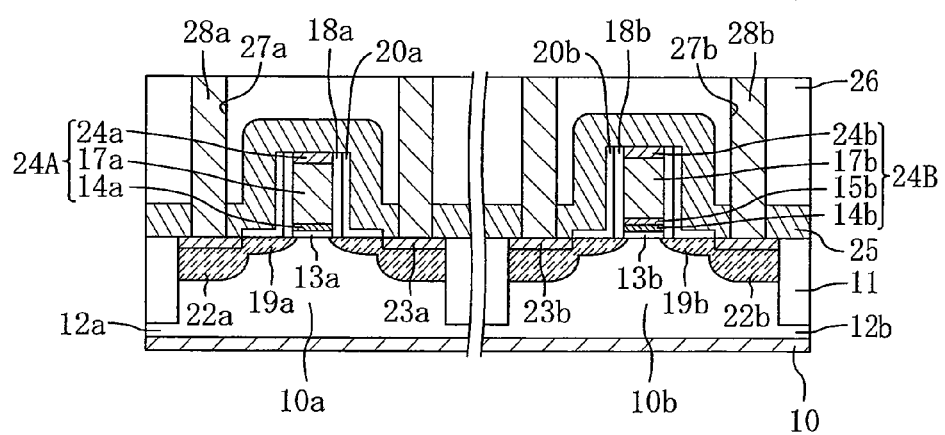

In the following, the technical idea of the present invention will be clearly described in detail using drawings. Any person skilled in the art of the technical field concerned who has understood the preferred example embodiments of the present invention can modify or make an addition to the preferred example embodiments based on the technique disclosed in the present disclosure, and this would not depart from the technical idea and scope of the present invention.

Referring to the drawings, each of the illustrative example embodiments of the present invention will be described below.

(Illustrative Example Embodiment 1)

A semiconductor device and a method for fabricating the same according to the first illustrative example embodiment will be described below with reference to the drawings.

FIGS. 1A-1C are structural views of the semiconductor device according to the first illustrative example embodiment, of which FIG. 1A is a plan view, FIG. 1B is a cross-sectional view in a gate width direction along the line Ib-Ib of FIG. 1A, and FIG. 1C is a cross-sectional view including a left-hand cross section in a gate length direction along the line Icn-Icn of FIG. 1A and a right-hand cross section in the gate length direction along the line Icp-Icp of FIG. 1A. Note that, in each of the drawings, a left-hand region is an n-type MIS formation region 10N where an n-type MIS transistor is to be formed, and a right-hand region is a p-type MIS formation region 10P where a p-type MIS transistor is to be formed.

As shown in FIG. 1A, a first active region 10a surrounded by an isolation region 11 is formed in the n-type MIS formation region 10N, while a second active region 10b surrounded by the isolation region 11 is formed in the p-type MIS formation region 10P. Over the first active region 10a, a first gate electrode 24A is formed via a first gate insulating film, while over the second active region 10b, a second gate electrode 24B is formed via a second gate insulating film. Preferably, each of the first and second gate insulating films has a structure in which, e.g., a high dielectric constant film having a thickness of 2 nm is formed on an underlying film formed of, e.g., a silicon dioxide film having a thickness of about 0.8 to 1 nm, and the high dielectric constant film is made of a metal oxide having a specific dielectric constant of not less than 10. On the side surfaces of the first and second gate electrodes 24A and 24B, first offset spacers 18a and second offset spacers 18b each formed of, e.g., a silicon dioxide film having a thickness of 10 nm and first inner sidewalls 20a and second inner sidewalls 20b are formed. Note that, in FIG. 1A, the depiction of an insulating film (denoted by the reference character 25 in FIG. 1C) and an interlayer insulating film (denoted by the reference character 26 in FIG. 1C), each described later, is omitted, but the insulating film and the interlayer insulating film are formed so as to cover the first and second gate electrodes 24A and 24B.

As shown in FIGS. 1B and 1C, in an upper portion of a semiconductor substrate 10, the isolation region 11 has been formed by burying an isolation film in a trench so as to partition the semiconductor substrate 10 into the n-type MIS formation region 10N and the p-type MIS formation region 10P. In the semiconductor substrate 10 in the n-type MIS formation region 10N, a p-type well region 12a has been formed by implanting a p-type impurity such as, e.g., B (boron), while in the semiconductor substrate 10 in the p-type MIS formation region 10P, an n-type well region 12b has been formed by implanting an n-type impurity such as, e.g., P (phosphorus). Over the first active region 10a, the first gate electrode 24A including a first metal film 14a, a first silicon film 17a, and a third metal silicide film 24a is formed via a first gate insulating film 13a, while over the second active region 10b, the second gate electrode 24B including a first metal film 14b, a second metal film 15b formed on the first metal film 14b, a second silicon film 17b, and a fourth metal silicide film 24b is formed via a second gate insulating film 13b.

The first metal films 14a and 14b and the second metal film 15b are made of, e.g., titanium nitride. It is desirable that the first metal films 14a and 14b and the second metal film 15b are made of the same metal material or the same metal compound material, and the densities of the first metal films 14a and 14b are lower than the density of the second metal film 15b. In addition, the thickness of the first metal film 14 is preferably not less than 1 nm and not more than 5 nm, as described later, and the thickness of the second metal film 15 is preferably such that the total thickness of the first and second metal films 14 and 15 is 10 to 20 nm. The first and second silicon films 17a and 17b are each formed of, e.g., a polysilicon film having a thickness of 100 nm. The third and fourth metal silicide films 24a and 24b are each formed of, e.g., a nickel silicide film.

As shown in FIG. 1C, on the side surfaces of the first and second gate electrodes 24A and 24B, the first and second offset spacers 18a and 18b and the first and second inner sidewalls 20a and 20b are formed. Laterally under a first-gate-electrode forming portion 14A in the first active region 10a, there are formed n-type source/drain regions (LDD regions or extension regions) 19a having an n-type impurity such as, e.g., As (arsenic) implanted therein and relatively shallow junction depths. On the other hand, laterally under a second-gate-electrode forming portion 14B in the second active region 10b, there are formed p-type source/drain regions (LDD regions or extension regions) 19b having a p-type impurity such as, e.g., BF$_2$ implanted therein and relatively shallow junction depths. Laterally outwardly under the first inner sidewalls 20a in the first active region 10a, there are formed n-type source/drain regions 22a having an n-type impurity such as, e.g., As (arsenic) implanted therein and relatively deep junction depths deeper than those of the n-type source/drain regions 19a having relatively shallow junction depths. On the other hand, laterally outwardly under the second inner sidewalls 20b in the second active region 10b, there are formed p-type source/drain regions 22b having a p-type impurity such as, e.g., B implanted therein and junction depths deeper than those of the p-type source/drain regions 19b having relatively shallow junction depths.

As shown in FIGS. 1B and 1C, over the semiconductor substrate 10, there are formed an insulating film 25 formed of, e.g., a silicon nitride film having a thickness of 50 nm and an interlayer insulating film 26 formed of, e.g., a silicon dioxide film so as to cover the first and second gate electrodes 24A and 24B. Further, as shown in FIGS. 1A and 1C, in the interlayer insulating film 26, there are formed a first contact plug 28a and a second contact plug 28b each including a barrier metal film formed by successively depositing titanium and titanium nitride on a bottom portion and a sidewall portion, and a tungsten film deposited inwardly of the barrier metal film. The first and second contact plugs 28a and 28b are formed so as to extend through the interlayer insulating film 26 and the insulating film 25, and come in contact with a first metal silicide film 23a and a second metal silicide film 23b each made of, e.g., nickel silicide. Over the interlayer insulating film 26, there are formed metal wires electrically connected to the first and second contact plugs 28a and 28b, though not shown.

The structures of the n-type MIS transistor and the p-type MIS transistor will be described below in detail with reference to FIG. 1C mentioned above.

As shown in the n-type MIS formation region 10N of FIG. 1C, an n-type MIS transistor NTr includes the first active region 10a of the semiconductor substrate 10 which is surrounded by the isolation region 11, the first gate insulating film 13a formed on the first active region 10a, the first gate electrode 24A including the first metal film 14a formed on the first gate insulating film 13a, the first silicon film 17a, and the third metal silicide film 24a, the first inner sidewalls 20a formed on the side surfaces of the first gate electrode 24A via the first offset spacers 18a and each having an L-shaped cross-sectional shape, the n-type source/drain regions 19a formed laterally under the first gate electrode 24A in the first active region 10a and having relatively shallow junction depths, the n-type source/drain regions 22a formed laterally outwardly under the first inner sidewalls 20a in the first active region 10a and having relatively deep junction depths, the insulating film 25 formed continuously over the first gate electrode 24A and over the upper surfaces of the regions of the first active region 10a located laterally to the first gate electrode 24A, and the first metal silicide film 23a formed in the upper portion of each of the n-type source/drain regions 22a having relatively deep junction depths.

As shown in the p-type MIS formation region $101^3$ of FIG. 1C, a p-type MIS transistor PTr includes the second active region 10b of the semiconductor substrate 10 which is surrounded by the isolation region 11, the second gate insulating film 13b formed on the second active region 10b, the second gate electrode 24B including the first metal film 14b formed on the second gate insulating film 13b, the second metal film 15b, the second silicon film 17b, and the fourth metal silicide film 24b, the second inner sidewalls 20b formed on the side surfaces of the second gate electrode 24B via the second offset spacers 18b and each having an L-shaped cross-sectional shape, the p-type source/drain regions 19b formed laterally under the second gate electrode 24B in the second active region 10b and having relatively shallow junction depths, the p-type source/drain regions 22b formed laterally outwardly under the second inner sidewalls 20b in the second active region 10b and having relatively deep junction depths, the insulating film 25 formed continuously over the second gate electrode 24B and over the upper surfaces of the regions of the second active region 10b located laterally to the second gate electrode 24B, and the second metal silicide film 23b formed in the upper portion of each of the p-type source/drain regions 22b having relatively deep junction depths.

The first metal film 14a forming the first gate electrode 24A of the n-type MIS transistor NTr is made of the same metal material (or metal compound material) as that of the first metal film 14b forming the second gate electrode 24B of the p-type MIS transistor PTr, and has the same density as that of the first metal film 14b. On the other hand, the second metal film 15b forming the second gate electrode 24B of the p-type MIS transistor PTr is made of the same material as those of the first metal films 14a and 14b, but has a density different from those of the first metal films 14a and 14b. The density of the second metal film 15b is higher than the densities of the first metal films 14a and 14b.

FIGS. 2A-2D, 3A-3D, and 4A-4C are cross-sectional views showing the principal portion of the foregoing semiconductor device according to the first illustrative example embodiment in the gate length direction thereof in the order of process steps of a fabrication method therefor. In each of the drawings, a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A. Note that, in each of the drawings, a left-hand region is the n-type MIS formation region 10N where the n-type MIS transistor is to be formed, and a right-hand region is the p-type MIS formation region 10P where the p-type MIS transistor is to be formed.

Figure 2:
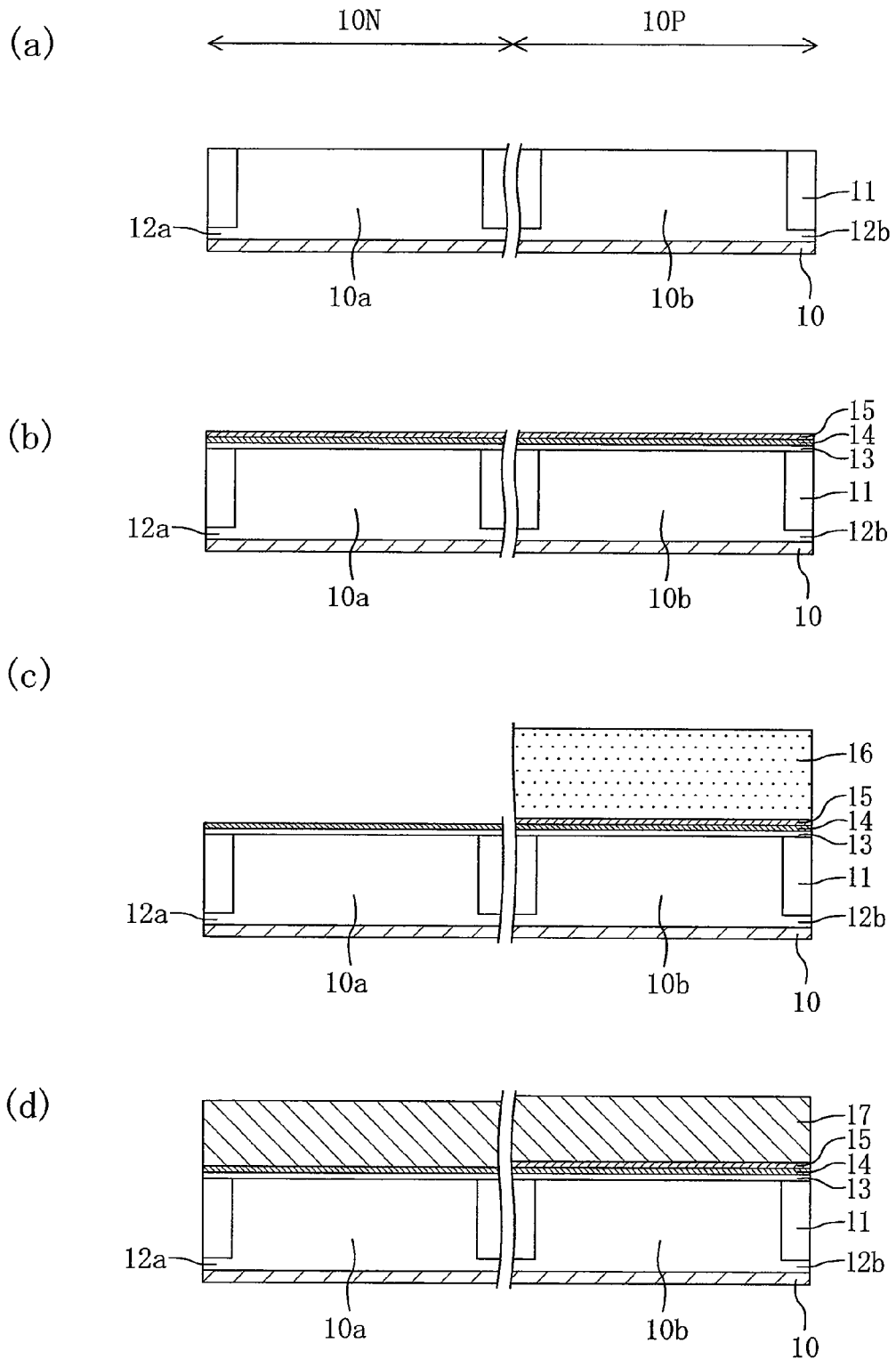
FIGS. 2A-2D are cross-sectional views showing the principal portion of the semiconductor device according to the first illustrative example embodiment in the gate length direction thereof in the order of process steps of a fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.

First, as shown in FIG. 2A, an insulating film is buried in a trench by, e.g., a shallow trench isolation (STI) process to selectively form the isolation region 11 in the upper portion of the semiconductor substrate 10 made of, e.g., p-type silicon. As a result, in the n-type MIS formation region 10N, the first active region 10a formed of the semiconductor substrate 10 surrounded by the isolation region 11 is formed, while in the p-type MIS formation region 10P, the second active region 10b formed of the semiconductor substrate 10 surrounded by the isolation region 11 is formed. Then, by a lithographic process and an ion implantation process, a p-type impurity such as, e.g., B (boron) is implanted into the semiconductor substrate 10 in the n-type MIS formation region 10N, while an n-type impurity such as, e.g., P (phosphorous) is implanted into the semiconductor substrate 10 in the p-type MIS formation region 10P. Thereafter, a heat treatment at, e.g., 850° C. is performed on the semiconductor substrate 10 for, e.g., 30 seconds, thereby forming the p-type well region 12a in the semiconductor substrate 10 in the n-type MIS formation region 10N, while forming the n-type well region 12b in the semiconductor substrate 10 in the p-type MIS formation region 10P.

Next, as shown in FIG. 2B, the surface of the semiconductor substrate 10 is cleaned by, e.g., a diluted hydrofluoric acid treatment, and then an underlying film (not shown) formed of, e.g., a silicon dioxide film having a thickness of about 0.8 to 1 nm is formed by, e.g., an in-situ steam generation (ISSG) oxidation process on each of the first active region 10a and the second active region 10b. Thereafter, by, e.g., a metal organic chemical vapor deposition (MOCVD) process, an atomic layer deposition (ALD) process, or the like, a gate-insulating-film forming film 13 made of, e.g., a high dielectric constant film having a thickness of 2 nm is deposited on the underlying film. Here, it is desirable that the gate-insulating-film forming film 13 includes the high dielectric constant film made of a metal oxide having a specific dielectric constant of not less than 10.

Subsequently, by, e.g., a chemical vapor deposition (CVD) process, an atomic layer deposition (ALD) process, a sputtering process, or the like, the first metal film 14 made of, e.g., titanium nitride (TiN) and the second metal film 15 are deposited. Here, it is desirable that the first metal film 14 and the second metal film 15 are made of the same metal material or the same metal compound material, and the density of the first metal film 14 is lower than that of the second metal film 15. By using a metal film having a high density, it is possible to reduce the diffusion of silicon from a silicon film formed on the metal film, and prevent a change (reduction) in work function. Metal films of the same type can be provided with different densities as follows. For example, in the case of using a CVD process, the density can be varied by varying a film deposition temperature. In the case of film deposition at a relatively low temperature, the density of metal decreases to result in a small work function. Moreover, as described later, the thickness of the first metal film 14 is preferably not less than 1 nm and not more than 5 nm, and the thickness of the second metal film 15 is preferably such that the total thickness of the first and second metal films 14 and 15 is 10 to 20 nm.

Next, as shown in FIG. 2C, a resist mask 16 covering the p-type MIS formation region 10P, and having an opening corresponding to the n-type MIS formation region 10N is formed on the second metal film 15 by a photolithographic process. Thereafter, using the resist mask 16, the second metal film 15 formed on the first metal film 14 in the n-type MIS formation region 10N is removed by a dry etching process or a wet etching process. Note that, in the step of etching away the second metal film 15, the difference between the etching rates of the first metal film 14 and the second metal film 15 due to the different densities thereof can be used. In this step, the first metal film 14 formed under the second metal film 15 may also be removed by etching to the extent that the first metal film 14 remains thin without being completely removed.

Next, as shown in FIG. 2D, the resist mask 16 is removed, and then a silicon film 17 formed of, e.g., a polysilicon film having a thickness of 100 nm is deposited by, e.g., a CVD process on the first metal film 14 in the n-type MIS formation region 10N and on the second metal film 15 in the p-type MIS formation region 10P. Here, a metal film having a low density is used as the first metal film 14, and the first metal film 14 is formed to have a small thickness (of, e.g., not less than 1 nm and not more than 5 nm) to allow silicon to be diffused from the silicon film formed on the first metal film 14, thereby enabling a reduction in the work function of the gate electrode of the n-type MIS transistor. The lower limit of the thickness of the first metal film 14 is not less than 1 nm because such a lower limit is desirable in terms of improving the deposition uniformity of the metal film and mitigating the depletion of the gate electrodes.

Figure 3:
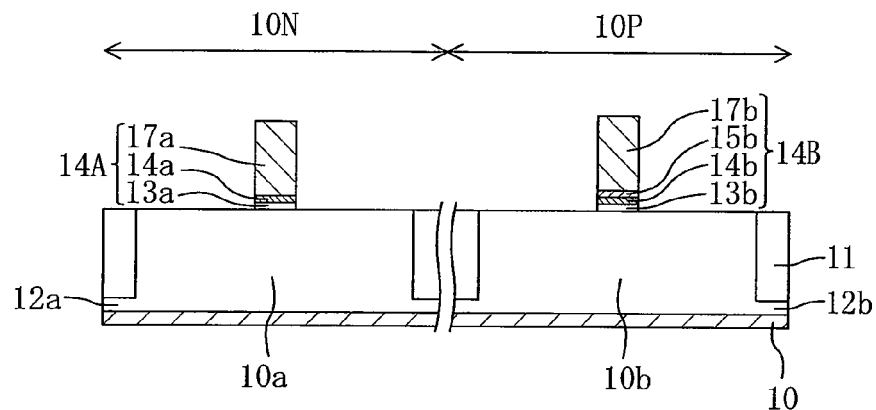
FIGS. 3A-3D are cross-sectional views showing the principal portion of the semiconductor device according to the first illustrative example embodiment in the gate length direction thereof in the order of process steps of the fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.
Figure 3:
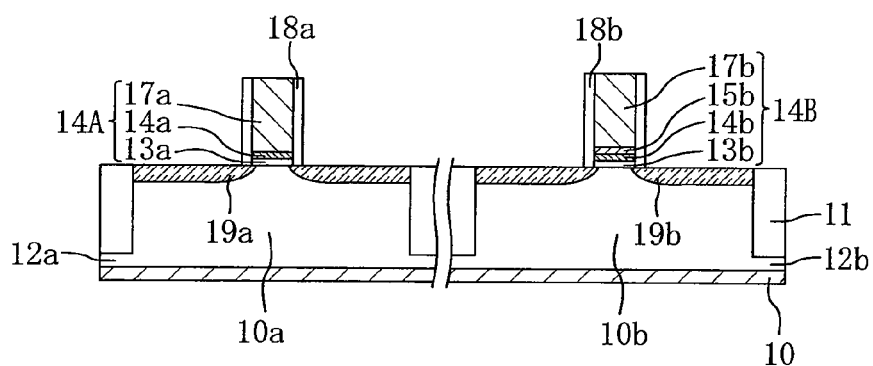
Figure 3:
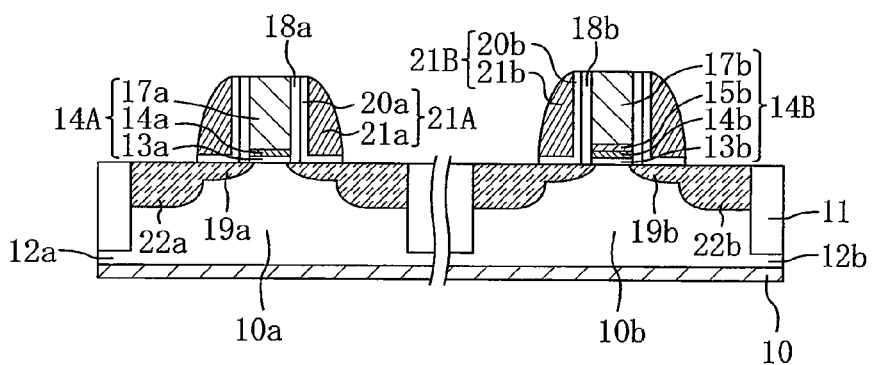
Figure 3:
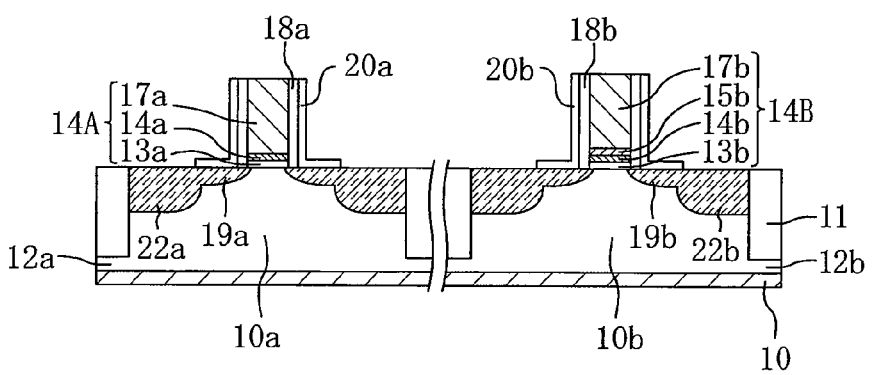

Next, as shown in FIG. 3A, a resist (not shown) having a gate pattern configuration is formed on the silicon film 17 by a photolithographic process. Then, using the resist as a mask, the silicon film 17, the second metal film 15, the first metal film 14, and the gate-insulating-film forming film 13 are successively patterned by a dry etching process. As a result, the first gate insulating film 13a, the first metal film 14a, and the first silicon film 17a are successively formed over the first active region 10a, while the second gate insulating film 13b, the first metal film 14b, the second metal film 15b, and the second silicon film 17b are successively formed over the second active region 10b.

In this manner, the first-gate-electrode forming portion 14A having the first gate insulating film 13a, the first metal film 14a, and the first silicon film 17a is formed over the first active region 10a, while the second-gate-electrode forming portion 14B having the second gate insulating film 13b, the first metal film 14b, the second metal film 15b, and the second silicon film 17b is formed over the second active region 10b.

Next, as shown in FIG. 3B, over the entire upper surface of the semiconductor substrate 10, an insulating film for offset spacers formed of, e.g., a silicon dioxide film having a thickness of 10 nm is deposited by, e.g., a CVD process, and then anisotropic etching is performed on the insulating film for offset spacers. In this manner, the first offset spacers 18a are formed on the side surfaces of the first-gate-electrode forming portion 14A, while the second offset spacers 18b are formed on the side surfaces of the second-gate-electrode forming portion 14B.

Subsequently, over the semiconductor substrate 10, a resist (not shown) having an opening corresponding to the n-type MIS formation region 10N, and covering the p-type MIS formation region 10P is formed. Then, using the first-gate-electrode forming portion 14A as a mask, an n-type impurity such as, e.g., Ar (arsenic) is implanted into the first active region 10a, thereby forming in a self-aligned manner the n-type source/drain regions (LDD regions or extension regions) 19a having relatively shallow junction depths, and located laterally under the first-gate-electrode forming portion 14A in the first active region 10a. On the other hand, over the semiconductor substrate 10, a resist (not shown) covering the n-type MIS formation region 10N, and having an opening corresponding to the p-type MIS formation region 10P is formed. Then, using the second-gate-electrode forming portion 14B as a mask, a p-type impurity such as, e.g., $BF_2$ is implanted into the second active region 10b, thereby self-alignedly forming the p-type source/drain regions (LDD regions or extension regions) 19b having relatively shallow junction depths, and located laterally under the second-gate-electrode forming portion 14B in the second active region 10b.

Next, as shown in FIG. 3C, over the entire upper surface of the semiconductor substrate 10, a first insulating film formed of, e.g., a silicon dioxide film having a thickness of 10 nm and a second insulating film formed of a silicon nitride film having a thickness of 30 nm are successively deposited by, e.g., a CVD process, and then anisotropic etching is performed on the first insulating film and the second insulating film. In this manner, on the side surfaces of the first-gate-electrode forming portion 14A, first sidewalls 21A including the first inner sidewalls 20a each formed of the first insulating film and having an L-shaped cross-sectional shape, and first outer sidewalls 21a each formed of the second insulating film and formed on the first inner sidewalls 20a are formed via the first offset spacers 18a. On the other hand, on the side surfaces of the second-gate-electrode forming portion 14B, second sidewalls 21B including the second inner sidewalls 20b each formed of the first insulating film and having an L-shaped cross-sectional shape, and second outer sidewalls 21b each formed of the second insulating film and formed on the second inner sidewalls 20b are formed via the second offset spacers 18b.

Subsequently, using the first-gate-electrode forming portion 14A, the first offset spacers 18a, and the first sidewalls 21A as a mask, an n-type impurity such as, e.g., As (arsenic) is implanted into the first active region 10a by a lithographic process and an ion implantation process, thereby self-alignedly forming the n-type source/drain regions 22a having relatively deep junction depths deeper than those of the shallow n-type source/drain regions 19a, and located laterally outwardly under the first sidewalls 21A in the first active region 10a. On the other hand, using the second-gate-electrode forming portion 14B, the second offset spacers 18b, and the second sidewalls 21B as a mask, a p-type impurity such as, e.g., B (boron) is implanted into the second active region 10b, thereby self-alignedly forming the p-type source/drain regions 22b having relatively deep junction depths deeper than those of the shallow p-type source/drain regions 19b, and located laterally outwardly under the second sidewalls 21B in the second active region 10b. Thereafter, by a heat treatment, the impurities contained in the deep n-type source/drain regions 22a and the deep p-type source/drain regions 22b are activated.

Next, as shown in FIG. 3D, the first outer sidewalls 21a (silicon nitride film) and the second outer sidewalls 21b (silicon nitride film) are removed using, e.g., a dry etching process or a wet etching process having a selectivity between the first and second outer sidewalls 21a and 21b and the first and second inner sidewalls 20a and 20b (silicon dioxide film).

Figure 4:
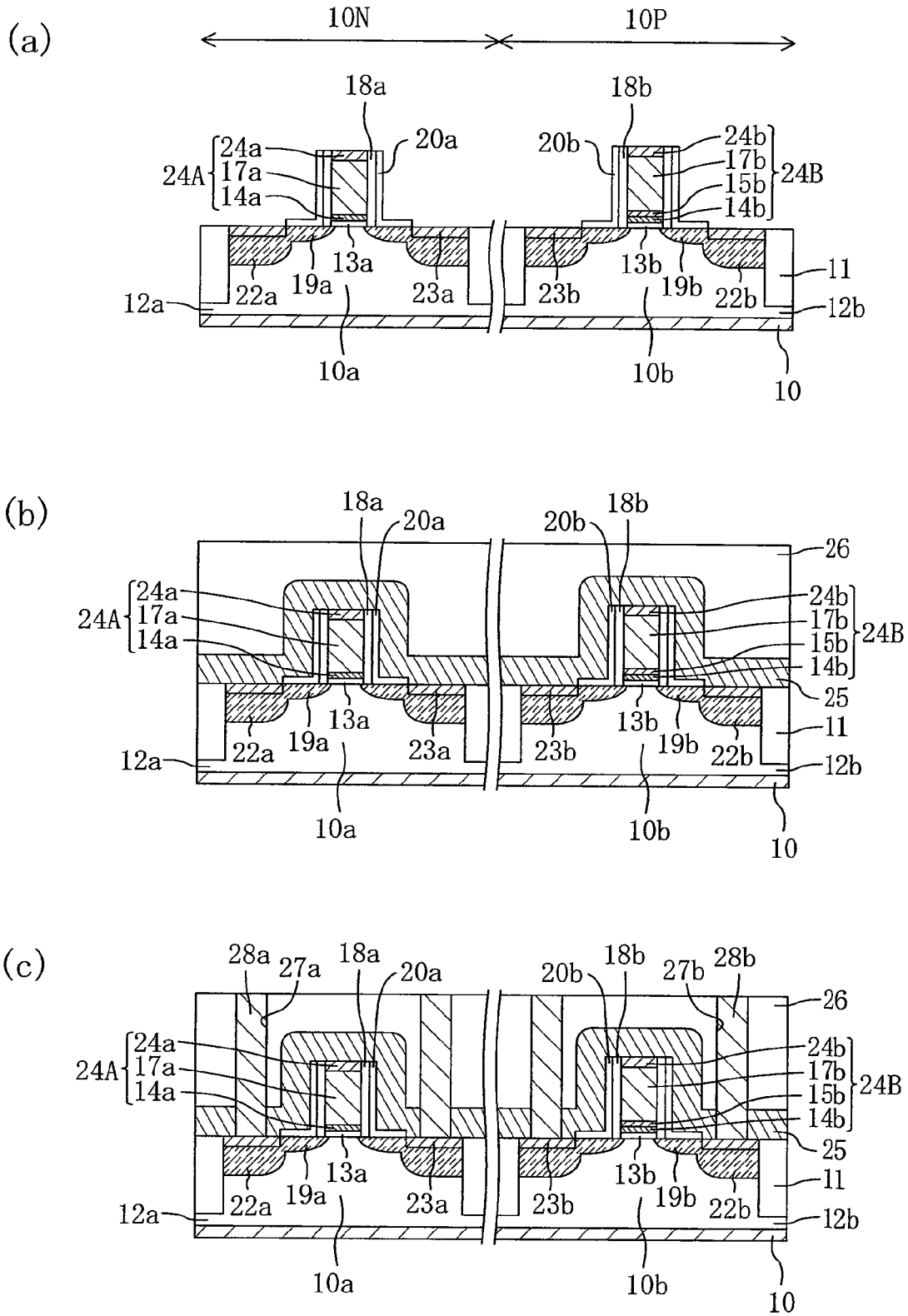
FIGS. 4A-4C are cross-sectional views showing the principal portion of the semiconductor device according to the first illustrative example embodiment in the gate length direction thereof in the order of process steps of the fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.

Next, as shown in FIG. 4A, natural oxide films (not shown) formed on the respective surfaces of the n-type and p-type source/drain regions 22a and 22b having relatively deep junction depths are removed. Then, by, e.g., a sputtering process, a metal film (not shown) made of, e.g., nickel and having a thickness of 10 nm is deposited over the entire upper surface of the semiconductor substrate 10. Thereafter, by, e.g., a first rapid thermal annealing (RTA) process performed in a nitrogen atmosphere at 320° C., a reaction is caused between Ni in the metal film and Si in the n-type and p-type source/drain regions 22a and 22b having relatively deep junction depths to form the first and second metal silicide films 23a and 23b each made of nickel silicide in the respective upper portions of the n-type and p-type source/drain regions 22a and 22b having relatively deep junction depths. Meanwhile, a reaction is caused between Ni in the metal film and Si in the first and second silicon films 17a and 17b to form the third metal silicide film 24a and the fourth metal silicide film 24b each made of nickel silicide in the respective upper portions of the first and second silicon films 17a and 17b. Then, by dipping the semiconductor substrate 10 in an etchant formed of a mixed solution of sulfuric acid and aqueous hydrogen peroxide, the unreacted portions of the metal film remaining on the isolation region 11, the first and second offset spacers 18a and 18b, the first and second sidewalls 21A and 21B, and the like are removed. Thereafter, by a second RTA process performed at a temperature (of, e.g., 550° C.) higher than the temperature in the first RTA process, the silicide composition ratios of the first and second metal silicide films 23a and 23b and the third and fourth metal silicide films 24a and 24b are stabilized.

Next, as shown in FIG. 4B, the insulating film 25 formed of, e.g., a silicon nitride film having a thickness of 50 nm is deposited by, e.g., a plasma CVD process over the entire upper surface of the semiconductor substrate 10.

Thus, the insulating film 25 is formed so as to cover the first-gate-electrode forming portion 14A having the third metal silicide film 24a formed on the surface thereof and the second-gate-electrode forming portion 14B having the fourth metal silicide film 24b formed on the surface thereof. The insulating film 25 is also formed in contact with the respective upper surfaces of the first sidewalls (i.e., the first inner sidewalls 20a) from which the first outer sidewalls 21a have been removed and the second sidewalls (i.e., the second inner sidewalls 20b) from which the second outer sidewalls 21b have been removed.

Subsequently, by, e.g., a CVD process, the interlayer insulating film 26 formed of, e.g., a silicon dioxide film is deposited on the insulating film 25. Then, by, e.g., a chemical mechanical polishing (CMP) process, the surface of the interlayer insulating film 26 is planarized.

Next, as shown in FIG. 4C, a resist (not shown) is formed on the interlayer insulating film 26 and then, using the resist as a mask, a first contact hole 27a and a second contact hole 27b which reach the upper surfaces of the first and second metal silicide films 23a and 23b are formed in the insulating film 25 and the interlayer insulating film 26 by a dry etching process in the same manner as in a typical method for fabricating a semiconductor device having MIS transistors. At this time, by using a 2-step etching process in which etching is halted once when the insulating film 25 is exposed, an amount of over-etching of each of the first and second metal silicide films 23a and 23b can be reduced.

Subsequently, by a sputtering process or a CVD process, titanium and titanium nitride are successively deposited over the bottom and sidewall portions of each of the first and second contact holes 27a and 27b to form a barrier metal film. Then, by a CVD process, a tungsten film is deposited on the interlayer insulating film 26 so as to be buried in each of the first and second contact holes 27a and 27b. Thereafter, by a CMP process, the tungsten film formed outside the first and second contact holes 27a and 27b is removed. Thus, the tungsten film is buried in each of the first and second contact holes 27a and 27b via the barrier metal film to form the first and second contact plugs 28a and 28b. Subsequently, on the interlayer insulating film 26, metal wires (not shown) electrically coupled to the first and second contact plugs 28a and 28b are formed.

In this manner, the semiconductor device according to the first illustrative example embodiment is fabricated. That is, the semiconductor device is fabricated which includes the n-type MIS transistor NTr having the first gate electrode 24A including the first metal film 14a, the first silicon film 17a, and the third metal silicide film 24a, and the p-type MIS transistor PTr having the second gate electrode 24B including the first metal film 14b, the second metal film 15b, the second silicon film 17b, and the fourth metal silicide film 24b.

Thus, unlike in the conventional embodiment described above, the method for fabricating the semiconductor device according to the first illustrative example embodiment does not include the step of etching away a metal film formed on a gate-insulating-film forming film. As a result, a semiconductor device is implemented in which degradation due to gate leakage current is inhibited.

Figure 8:
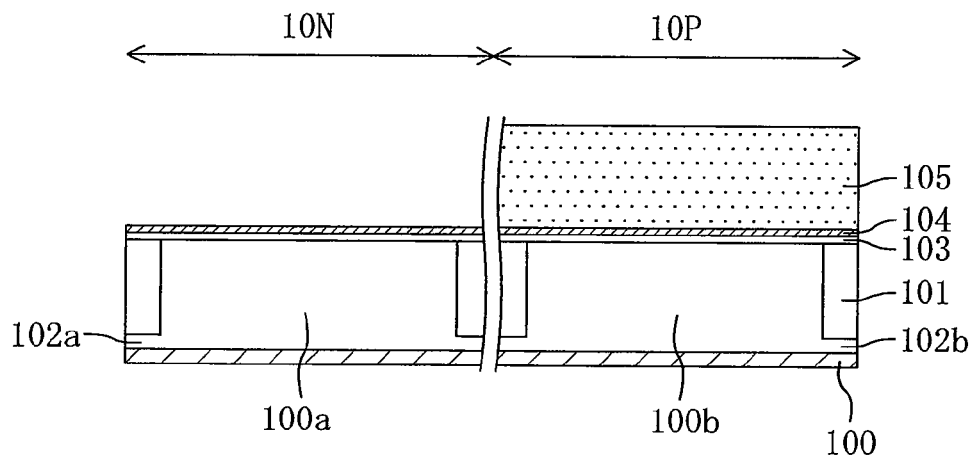
FIGS. 8A-8C are cross-sectional views showing the principal portion of a conventional semiconductor device in the gate length direction thereof in the order of process steps of a fabrication method therefor.
Figure 8:
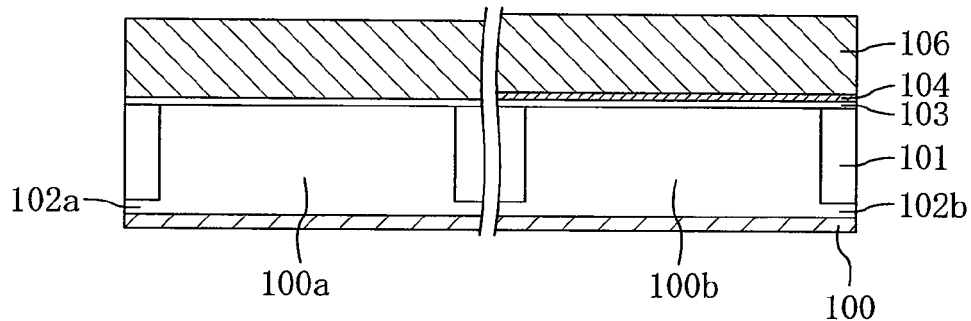
Figure 8:
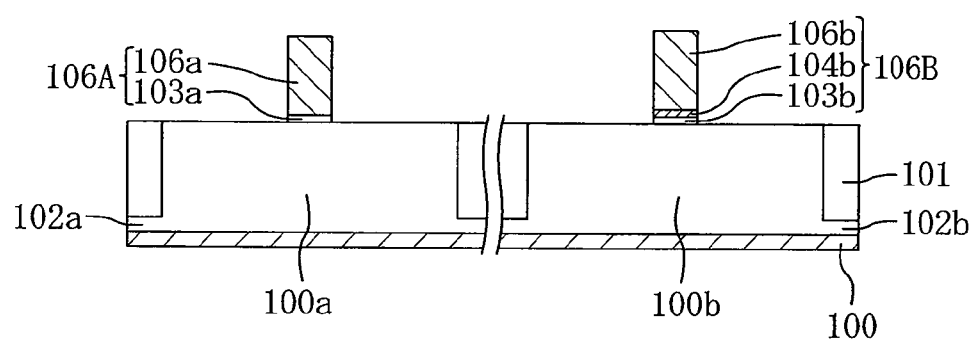

In the method for fabricating the conventional semiconductor device, as shown in FIG. 8C mentioned above, the first-gate-electrode forming portion 106A and the second-gate-electrode forming portion 106B are formed by patterning in the same step, i.e., under the same etching conditions in spite of the mutually different structures thereof (specifically, the first-gate-electrode forming portion 106A has a double-layer structure, while the second-gate-electrode forming portion 106B has a triple-layer structure). This has resulted in the problem that neither of the first gate electrode and the second gate electrode can be formed with high accuracy. For example, if etching conditions for accurately forming the first gate electrode are adopted, the metal film 104 and the gate-insulating-film forming film 103 in the P-type MIS formation region 10P remain without being etched, and accordingly, the second gate electrode cannot be formed with high accuracy.

On the other hand, if etching conditions for accurately forming the second gate electrode are adopted, e.g., the semiconductor substrate 100 in the n-type MIS formation region 10N and the isolation region 101 are partially etched, and accordingly, the first gate electrode cannot be formed with high accuracy. More specifically, after the first silicon film 106a and the second silicon film 106b are formed from the silicon film 106 by a dry etching process, an etching gas is changed for the etching of the metal film 104 forming the second gate electrode, and then the metal film 104 forming the second gate electrode is etched. During the etching of the metal film, in order to first etch a layer resulting from extremely slight oxidation of the surface of the metal film, a breakthrough step is performed first. At this time, the problem is encountered that, since a metal film is not formed on the gate-insulating-film forming film 103 in the n-type MIS formation region 10N, the gate-insulating-film forming film 103 in the n-type MIS formation region 10N is extremely prone to grating due to the breakthrough step.

By contrast, in the method for fabricating the semiconductor device according to the first illustrative example embodiment, when the first- and second-gate-electrode forming portions 14A and 14B are formed by etching, the metal film 14 has been formed on the gate-insulating-film forming film 13 in each of the n-type MIS formation region 10N and the p-type MIS formation region 10P. This prevents the gate insulating film in either one of the n-type MIS formation region 10N and the p-type MIS formation region 10P from being etched by the breakthrough step, and allows the gate electrodes of the n-type and p-type MIS transistors to be implemented with high accuracy.

(Variation of Illustrative Example Embodiment 1)

A semiconductor device and a method for fabricating the same according to a variation of the first illustrative example embodiment will be described with reference to the drawings.

FIGS. 5A-5D are cross-sectional views showing the principal portion of the semiconductor device according to the variation of the first illustrative example embodiment in the gate length direction thereof in the order of process steps of the fabrication method therefor. In each of drawings, a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A. In each of the drawings, a left-hand region is the n-type MIS formation region 10N where an n-type MIS transistor is to be formed, and a right-hand region is the p-type MIS formation region 10P where a p-type MIS transistor is to be formed. Note that the description of the method for fabricating the semiconductor device according to the present variation will center around differences with the method for fabricating the semiconductor device according to the first illustrative example embodiment described above, and omit commonalities therewith as appropriate.

Figure 5:
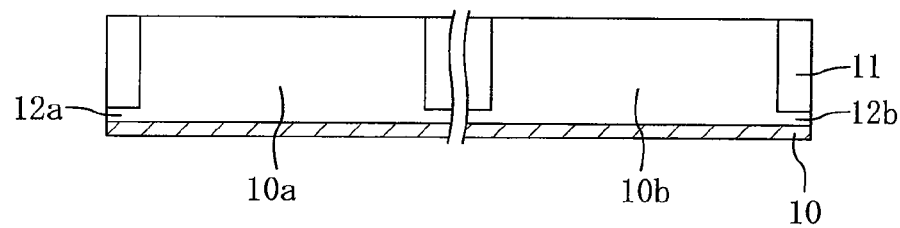
FIGS. 5A-5D are cross-sectional views showing the principal portion of a semiconductor device according to a variation of the first illustrative example embodiment in the gate length direction thereof in the order of process steps of a fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.
Figure 5:
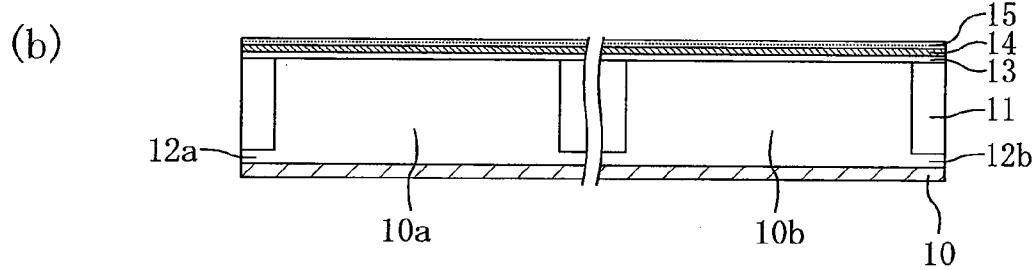
Figure 5:
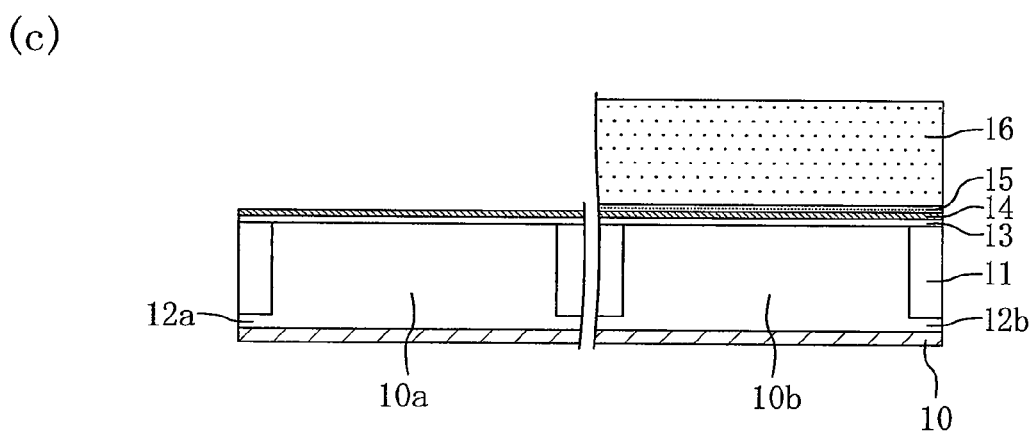
Figure 5:
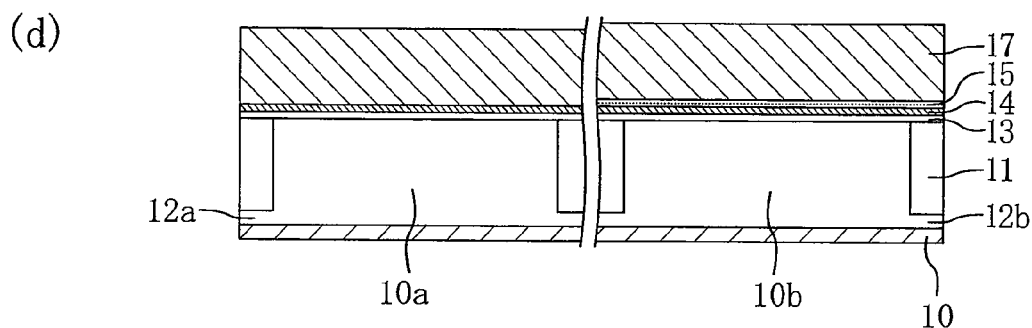

First, the same step as illustrated in FIG. 2A described above is performed so that the structure shown in FIG. 5A (i.e., the same structure as that shown in FIG. 2A) is obtained.

Next, as shown in FIG. 5B, the surface of the semiconductor substrate 10 is cleaned by, e.g., a diluted hydrofluoric acid treatment. Then, by, e.g., an ISSG oxidation process, an underlying film (not shown) formed of, e.g., a silicon dioxide film having a thickness of about 0.8 to 1 nm is formed on each of the first active region 10a and the second active region 10b. Thereafter, by, e.g., a MOCVD process, an ALD process, or the like, the gate-insulating-film forming film 13 formed of, e.g., a high dielectric constant film having a thickness of 2 nm, is deposited on the underlying film. Here, it is desirable that the gate-insulating-film forming film 13 includes a high dielectric constant film made of a metal oxide having a specific dielectric constant of not less than 10.

Subsequently, by, e.g., a CVD process, an ALD process, a sputtering process, or the like, the first metal film 14 made of, e.g., titanium nitride (TiN) and the second metal film 15 made of, e.g., tantalum nitride (TaN) are deposited. Here, the first metal film 14 and the second metal film 15 are made of different metal materials or different metal compound materials. In the same manner as described above, the thickness of the first metal film 14 is preferably not less than 1 nm and not more than 5 nm, and the thickness of the second metal film 15 is preferably such that the total thickness of the first and second metal films 14 and 15 is 10 to 20 nm.

Next, as shown in FIG. 5C, the resist mask 16 covering the p-type MIS formation region 10P, and having an opening corresponding to the n-type MIS formation region 10N is formed on the second metal film 15 by a photolithographic process. Thereafter, using the resist mask 16, the second metal film 15 formed on the first metal film 14 in the n-type MIS formation region 10N is selectively removed by a dry etching process or a wet etching process. In this step, the first metal film 14 formed under the second metal film 15 may be removed by etching to a degree that the first metal film 14 remains thin without being completely removed.

Next, as shown in FIG. 5D, after the resist mask 16 is removed, the silicon film 17 formed of, e.g., a polysilicon film having a thickness of 100 nm is deposited by, e.g., a CVD process on the first metal film 14 in the n-type MIS formation region 10N and on the second metal film 15 in the p-type MIS formation region 10P.

Thereafter, the same steps as those shown in FIGS. 3A-3D and 4A-4C described above are successively performed so that a structure such as shown in FIG. 4C is obtained.

In this manner, the semiconductor device according to the variation of the first illustrative example embodiment is fabricated. That is, the semiconductor device is fabricated which includes the n-type MIS transistor NTr having the first gate electrode 24A including the first metal film 14a formed on the first gate insulating film 13a, the first silicon film 17a, and the third metal silicide film 24a, and the p-type MIS transistor PTr having the second gate electrode 24B including the first metal film 14b formed on the second gate insulating film 13b, the second metal film 15b, and the fourth metal silicide film 24b.

According to the variation of the first illustrative example embodiment, the same effects as those obtained according to the first illustrative example embodiment described above can be obtained. In addition, since the first metal films 14a and 14b and the second metal film 15b are made of different metal materials or different metal compound materials, the second metal film 15 formed on the first metal film 14 in the n-type MIS formation region 10N can be easily selectively removed in the step shown in FIG. 5C. As a result, it is possible to stably implement the semiconductor device.

(Illustrative Example Embodiment 2)

A semiconductor device and a method for fabricating the same according to a second illustrative example embodiment will be described with reference to the drawings.

FIGS. 6A-6D, 7A, and 7B are cross-sectional views showing the principal portion of the semiconductor device according to the second illustrative example embodiment in the gate length direction thereof in the order of process steps of the fabrication method therefor. In each of drawings, a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A. Note that, in each of the drawings, a left-hand region is the n-type MIS formation region 10N where an n-type MIS transistor is to be formed, and a right-hand region is the p-type MIS formation region 10P where a p-type MIS transistor is to be formed. Note that the description of the method for fabricating the semiconductor device according to the present variation will center around differences with the method for fabricating the semiconductor device according to the first illustrative example embodiment, and omit commonalities therewith as appropriate.

Figure 6:
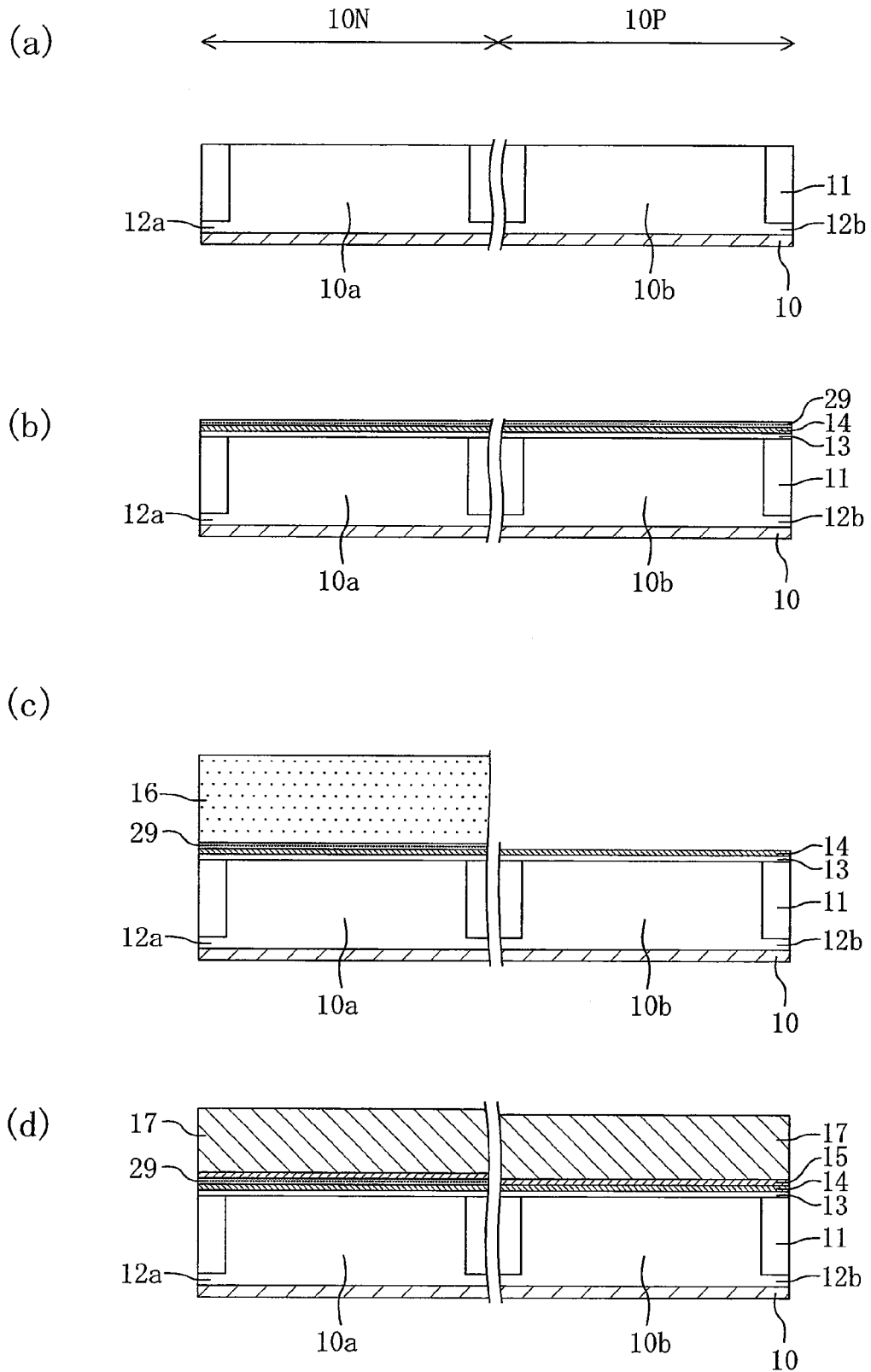
FIGS. 6A-6D are cross-sectional views showing the principal portion of a semiconductor device according to a second illustrative example embodiment in the gate length direction thereof in the order of process steps of a fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.

First, the same step as illustrated in FIG. 2A in the first illustrative example embodiment is performed so that the structure (i.e., the same structure as shown in FIG. 2A) shown in FIG. 6A is obtained.

Next, as shown in FIG. 6B, the surface of the semiconductor substrate 10 is cleaned by, e.g., a diluted hydrofluoric acid treatment, and then an underlying film (not shown) formed of, e.g., a silicon dioxide film having a thickness of about 0.8 to 1 nm is formed by, e.g., an ISSG oxidation process on each of the first active region 10a and the second active region 10b. Thereafter, by, e.g., a MOCVD process, an ALD process, or the like, the gate-insulating-film forming film 13 made of, e.g., a high dielectric constant film having a thickness of 2 nm is deposited on the underlying film. Here, it is desirable that the gate-insulating-film forming film 13 includes the high dielectric constant film made of a metal oxide having a specific dielectric constant of not less than 10.

Subsequently, by, e.g., a CVD process, an ALD process, a sputtering process, or the like, the first metal film 14 made of, e.g., titanium nitride (TiN) is deposited, and then a conductive film 29 formed of, e.g., a polysilicon film having a thickness of 10 nm is subsequently deposited on the first metal film 14 by, e.g., a CVD process. In the same manner as described above, the thickness of the first metal film 14 is preferably not less than 1 nm and not more than 5 nm.

Next, as shown in FIG. 6C, the resist mask 16 covering the n-type MIS formation region 10N, and having an opening corresponding to the p-type MIS formation region 10P is formed on the conductive film 29 by a photolithographic process. Thereafter, using the resist mask 16, the conductive film 29 formed on the first metal film 14 in the p-type MIS formation region 10P is selectively removed by a dry etching process or a wet etching process.

Next, as shown in FIG. 6D, the resist mask 16 is removed, and then the second metal film 15 is deposited by, e.g., a CVD process, an ALD process, a sputtering process, or the like on the conductive film 29 in the n-type MIS formation region 1 ON and on the first metal film 14 in the p-type MIS formation region 10P. Subsequently, by, e.g., a CVD process, the silicon film 17 formed of, e.g., a polysilicon film having a thickness of 100 nm is deposited. Here, the material of the second metal film 15 may be the same as or different from that of the first metal film 14, and the thickness of the second metal film 15 is preferably such that the total thickness of the first and second metal films 14 and 15 is 10 to 20 nm.

Figure 7:
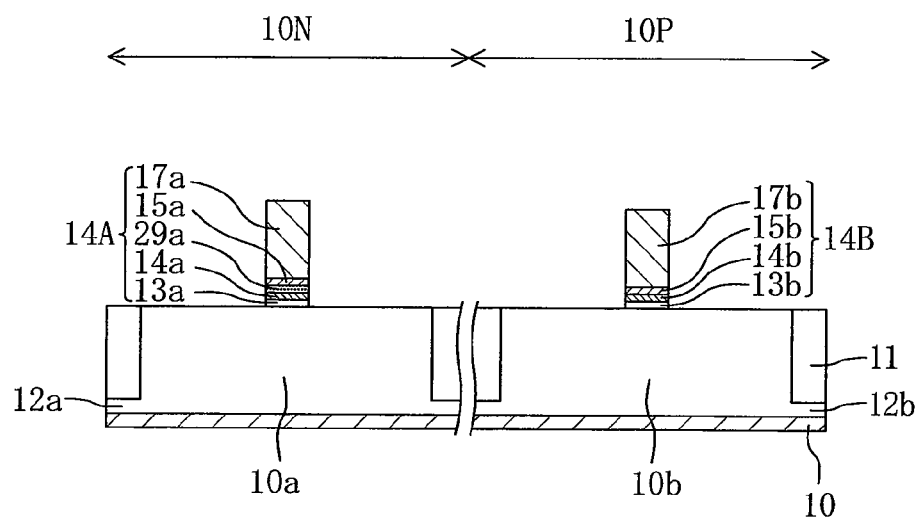
FIGS. 7A and 7B are cross-sectional views showing the principal portion of the semiconductor device according to the second illustrative example embodiment in the gate length direction thereof in the order of process steps of the fabrication method therefor, in each of which a left-hand cross section is a cross-sectional view in the gate length direction corresponding to the line Icn-Icn of FIG. 1A, and a right-hand cross section is a cross-sectional view in the gate length direction corresponding to the line Icp-Icp of FIG. 1A.
Figure 7:
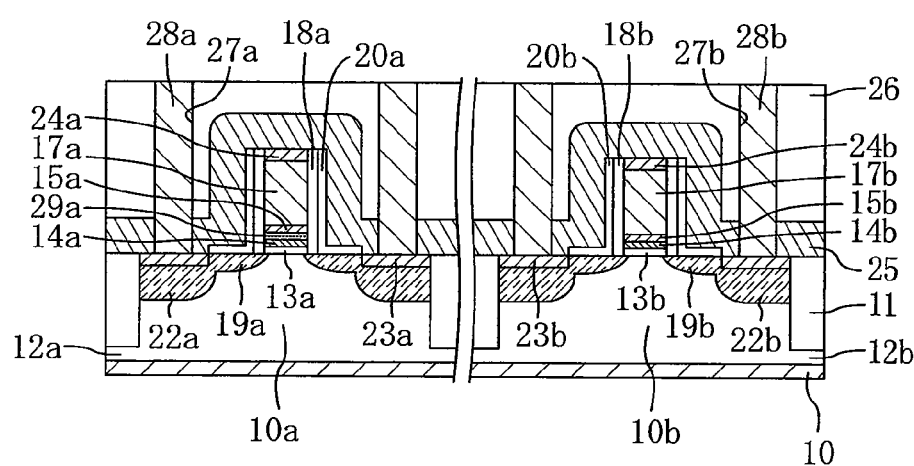

Next, as shown in FIG. 7A, a resist (not shown) having a gate pattern configuration is formed on the silicon film 17 by a photolithographic process. Then, using the resist as a mask, the silicon film 17, the second metal film 15, the conductive film 29, the first metal film 14, and the gate-insulating-film forming film 13 are successively patterned by a dry etching process. As a result, the first gate insulating film 13a, the first metal film 14a, a first conductive film 29a, a second metal film 15a, and the first silicon film 17a are successively formed over the first active region 10a, while the second gate insulating film 13b, the first metal film 14b, the second metal film 15b, and the second silicon film 17b are successively formed over the second active region 10b.

In this manner, the first-gate-electrode forming portion 14A having the first gate insulating film 13a, the first metal film 14a, the first conductive film 29a, the second metal film 15a, and the first silicon film 17a is formed over the first active region 10a, while the second-gate-electrode forming portion 14B having the second gate insulating film 13b, the first metal film 14b, the second metal film 15b, and the second silicon film 17b is formed over the second active region 10b.

Subsequently, the same steps as those shown in FIGS. 3B-3D and 4A-4C in the first illustrative example embodiment are successively performed so that a structure such as shown in FIG. 7B is obtained.

In this manner, the semiconductor device according to the second illustrative example embodiment is fabricated. That is, the semiconductor device is fabricated which includes the n-type MIS transistor NTr having the first gate electrode 24A including the first metal film 14a formed on the first gate insulating film 13a, the first conductive film 29a, the second metal film 15a, the first silicon film 17a, and the third metal silicide film 24a, and the p-type MIS transistor PTr having the second gate electrode 24B including the first metal film 14b formed on the second gate insulating film 13b, the second metal film 15b, the second silicon film 17b, and the fourth metal silicide film 24b.

According to the second illustrative example embodiment, the same effects as those obtained according to the first illustrative example embodiment described above can be obtained. In addition, since the first conductive film 29a is formed on the first metal film 14a in the n-type MIS formation region 10N, the work function of the gate electrode of the n-type MIS transistor is influenced by the diffusion of silicon from the first conductive film 29a formed of the silicon film so that a work function of not more than 4.6 eV is achievable. On the other hand, since the second metal film 15b is formed on the first metal film 14b in the p-type MIS formation region 10P, the influence of the diffusion of silicon from the second silicon film 17b decreases so that a work function of not less than 4.6 eV is achievable.

In the first and second illustrative example embodiments, the description has been given using, as a specific example, the case where the underlying insulating film formed of the silicon nitride film is formed as the insulating film 25 shown in FIGS. 1B, 1C, 4B, and 7B by, e.g., a plasma CVD process. However, the present invention is not limited thereto. For example, as the insulating film 25, there may be formed a stress insulating film which produces a tensile strength in the gate length direction of the channel region in the first active region 10a. Specific examples of a method for forming the stress insulating film include a method which deposits a silicon nitride film containing a large amount of hydrogen, and then dissipates hydrogen contained in the silicon nitride film by UV irradiation, thereby forming the stress insulating film formed of the silicon nitride film. At this time, a tensile strength occurs in the gate length direction of the channel region in the second active region 10b. However, if the channel direction is oriented in the <100> direction, there is substantially no stress effect of hole mobility, and accordingly, the degradation of the driving ability of the p-type MIS transistor can be avoided.

This allows the stress insulating film to apply the tensile strength in the gate length direction of the channel region in the first active region 10a, and improve the driving ability of the n-type MIS transistor.

In addition, since the stress insulating film is formed after the first and second outer sidewalls 21a and 21b are removed, the stress insulating film can be formed accordingly thicker by the thicknesses of the removed first and second outer sidewalls 21a and 21b. This allows the tensile strength to be applied effectively in the gate length direction of the channel region in the first active region 10a. Further, since the stress insulating film can be formed accordingly closer to the channel region in the first active region 10a by the thicknesses of the removed first and second outer sidewalls 21a and 21b, the tensile strength can be applied more effectively in the gate length direction of the channel region in the first active region 10a.

In the case where the stress insulating film, not the underlying insulating film, is thus used as the insulating film 25, by removing the first and second outer sidewalls 21a and 21b in advance prior to the formation of the stress insulating film, the tensile strength produced by the stress insulating film can be applied effectively in the gate length direction of the channel region in the first active region 10a.

In such a case, however, it is possible to remove only the first outer sidewalls 21a without removing the second outer sidewalls 21b and form, over these structures, the insulating film 25 formed of the stress insulating film which produces the tensile strength in the gate length direction of the channel region in the first active region 10a. This is because, since the stress insulating film is used for the purpose of producing the tensile strength in the gate length direction of the channel region in the first active region 10a, in order to inhibit the influence on the channel region in the second active region 10b, it is preferable if the stress insulating film can be formed at a distance from the second active region. Note that, in this case also, the degradation of the driving ability of the p-type MIS transistor can be avoided by orienting the channel direction in the <100> direction in the same manner as described above.

Specific examples of the material of the gate-insulating-film forming film 13 in the first and second illustrative example embodiments include a hafnium-based oxide such as hafnium oxide ($HfO_2$), hafnium silicate (HfSiO), or hafnium silicate nitride (HfSiON), and an oxide containing tantalum (Ta), zirconium (Zr), titanium (Ti), aluminum (Al), scandium (Sc), yttrium (Y), or lanthanum (La).

In the first and second illustrative example embodiments, the polysilicon film is used as the silicon film 17. However, instead of the polysilicon film, a silicon film made of another semiconductor material including, e.g., an amorphous silicon film, a silicon film, or the like may also be used.

In the second illustrative example embodiment, the polysilicon film is used as the conductive film 29. However, instead of the polysilicon film, a silicon film made of another semiconductor material including, e.g., amorphous silicon may also be used.

In the first and second illustrative example embodiments, the metal film made of nickel is used as the metal film caused to react with the upper portions of n-type and p-type source/drain regions 22a and 22b having relatively deep junction depths in the formation of the first and second metal silicide films 23a and 23b and as the metal film caused to react with the upper portions of the first and second silicon films 17a and 17b in the formation of the third and fourth metal silicide films 24a and 24b. However, instead of the metal film made of nickel, a metal film made of, e.g., a metal for silicidation such as platinum, cobalt, titanium, or tungsten may also be used.

The technique disclosed in the present disclosure is useful for a semiconductor device having a metal gate structure in which degradation due to gate leakage current can be inhibited and for a method for fabricating the same. The technique disclosed in the present invention is also useful for a method of accurately forming the gate electrodes of an n-type MIS transistor and a p-type MIS transistor.

What is claimed is:

1. A semiconductor device, comprising:
    a first MIS transistor formed on a first active region of a semiconductor substrate; and
    a second MIS transistor formed on a second active region of the semiconductor substrate, wherein
    the first MIS transistor includes:
    a first gate insulating film formed on the first active region; and
    a first gate electrode including a first metal film formed on the first gate insulating film, and a first silicon film formed on the first metal film, and
    the second MIS transistor includes:
    a second gate insulating film formed on the second active region; and
    a second gate electrode including the first metal film formed on the second gate insulating film, a second metal film formed on the first metal film, and a second silicon film formed on the second metal film.

2. The semiconductor device of claim 1, wherein
    the first metal film and the second metal film are made of the same metal material, and
    a density of the first metal film is lower than a density of the second metal film.

3. The semiconductor device of claim 1, wherein the first metal film and the second metal film are made of different metal materials.

4. The semiconductor device of claim 1, wherein the first gate electrode further includes a conductive film formed on the first metal film, and a second metal film formed between the conductive film and the first silicon film.

5. The semiconductor device of claim 4, wherein the conductive film is formed of a silicon film.

6. The semiconductor device of claim 1, wherein a thickness of the first metal film is not less than 1 nm and not more than 5 nm.

7. The semiconductor device of claim 1, wherein the first gate insulating film and the second gate insulating film are made of the same insulating material.

8. The semiconductor device of claim 1, wherein each of the first gate insulating film and the second gate insulating film includes a high dielectric constant film made of a metal oxide having a specific dielectric constant of not less than 10.

9. The semiconductor device of claim 1, wherein
    the first gate electrode further includes a first silicide film formed in an upper portion of the first silicon film, and
    the second gate electrode further includes a second silicide film formed in an upper portion of the second silicon film.

10. The semiconductor device of claim 1, further comprising:
    an insulating film formed over the semiconductor substrate so as to cover the first gate electrode and the second gate electrode.

11. The semiconductor device of claim 10, further comprising:
    first sidewalls formed on side surfaces of the first gate electrode, and each having an L-shaped cross-sectional shape; and
    second sidewalls formed on side surfaces of the second gate electrode, and each having an L-shaped cross-sectional shape, wherein
    the insulating film is formed in contact with respective upper surfaces of the first sidewalls and the second sidewalls.

12. The semiconductor device of claim 1, wherein
    the first MIS transistor is an n-type MIS transistor, and
    the second MIS transistor is a p-type MIS transistor.

* * * * *